United States Patent
Nishida

(10) Patent No.: US 6,515,469 B2
(45) Date of Patent: Feb. 4, 2003

(54) TESTING APPARATUS FOR SEMICONDUCTOR INTEGRATED CIRCUITS AND A METHOD FOR MANAGING THE SAME

(75) Inventor: Takatsugi Nishida, Miyazaki (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 0 days.

(21) Appl. No.: 09/755,055

(22) Filed: Jan. 8, 2001

(65) Prior Publication Data

US 2002/0036493 A1 Mar. 28, 2002

(30) Foreign Application Priority Data

Sep. 28, 2000 (JP) .................................... 2000-295314

(51) Int. Cl.[7] .............................................. G01R 31/26
(52) U.S. Cl. ..................................... 324/158.1; 324/765
(58) Field of Search ................................. 324/731, 158.1, 324/765; 414/222.03, 935; 73/865.9; 438/14, 18

(56) References Cited

U.S. PATENT DOCUMENTS

| | | | |
|---|---|---|---|
| 5,209,132 A | * | 5/1993 | Chayamichi et al. ...... 73/865.9 |
| 5,489,854 A | | 2/1996 | Buck et al. |
| 5,621,312 A | * | 4/1997 | Achor et al. ............. 324/158.1 |
| 5,847,572 A | | 12/1998 | Iwasaki et al. |

FOREIGN PATENT DOCUMENTS

| | | |
|---|---|---|
| JP | 07-128403 | 5/1995 |
| JP | 08-201466 | 8/1996 |
| JP | 09-197002 | 7/1997 |

* cited by examiner

Primary Examiner—Vinh P. Nguyen
(74) Attorney, Agent, or Firm—Rabin & Berdo, P.C.

(57) ABSTRACT

A method of managing a testing apparatus for quality control test of ICs, which method can suppress a decrease in efficiency of the testing apparatus. When a test result is given that successive defective articles occurred in mutually different test samples in an electrical measurement test by a testing apparatus (10), a standard sample whose electrical characteristics have been confirmed is put to an electrical measurement for reassuring purposes. If a test result by this measurement is within a specified tolerance, a decision is made that the test function of the testing apparatus is normal, but if the test result is outside the tolerance, a decision is made that the test function is abnormal.

6 Claims, 2 Drawing Sheets

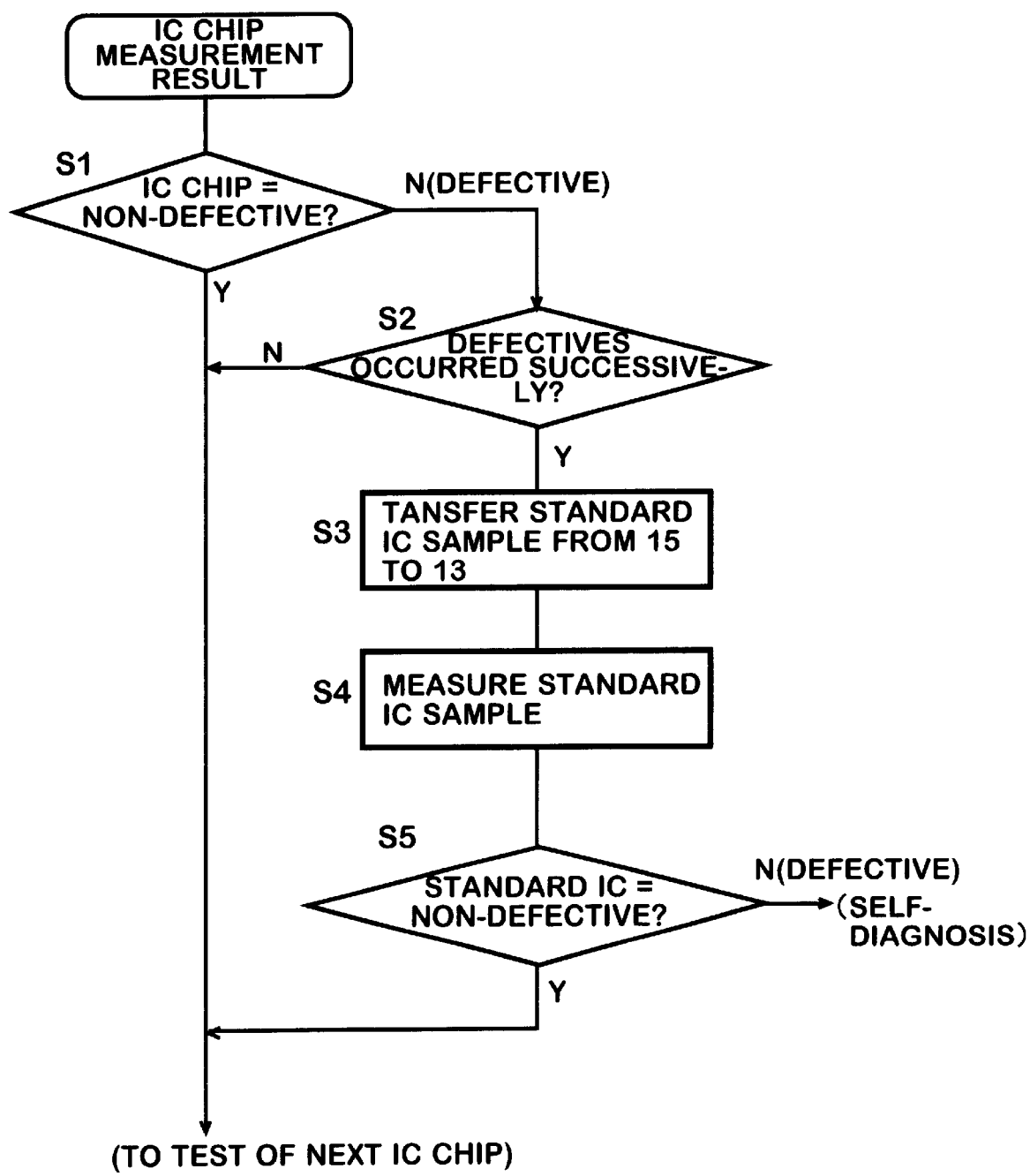

TESTING APPARATUS FOR SEMICONDUCTOR INTEGRATED CIRCUITS AND A METHOD FOR MANAGING THE SAME

BACKGROUND OF THE INVENTION

1. Field of the Invention

The present invention relates to a testing apparatus for investigating whether a semiconductor integrated circuit (hereafter referred to simply as an IC) obtained in a manufacturing process has adequate electrical characteristics or not to qualify it as a product, and also concerns a method for managing said testing apparatus by checking whether or not the test function of the testing apparatus is operating normally.

2. Description of Related Art

Conventionally, in a testing apparatus for ICs, when a plurality of IC chips, such as molded IC modules, have been arranged on a test standby part, the IC chips are transferred one after another by a handling mechanism to the test sample placement part for test. Each IC chip is subjected to an electrical measurement test at the test sample placement part, and if a measured value is within a specified tolerance, the test sample is determined as normal. After the test, the test samples are transferred one after another by the handling mechanism from the test sample placement part to the test sample return part.

Meanwhile, in the above-mentioned IC chip test process, if measured values are successively outside the specified tolerance for a plurality of test samples, the IC chips are most likely to be defective, but there is also a possibility that the test function itself of the testing apparatus is out of order.

Heretofore, in such a case, judgement as to whether the IC chips or the testing apparatus is abnormal has depended on the sense of the expert. As long as judgement depends on the expert's sense, it is not easy to make a quick and correct judgement. Moreover, if acceptable-quality IC chips are judged defective by an erroneous judgement, the production yield will decrease.

When measured values that are outside the required tolerance are obtained successively for a plurality of IC chips as mentioned above, without relying on the worker's sense, by running a diagnostic program incorporated in the testing apparatus for diagnosis of the test function of the testing apparatus, it becomes possible to make a correct decision as to the test function of the testing apparatus.

However, when the diagnostic program is executed, time is required for activating and executing the program, with the result that this interruption time amounts to a considerable length until the test operation on ICs is resumed. This causes a drop in efficiency in quality control test for ICs, which has become a problem.

Therefore, the object of the present invention is to provide a testing method and a testing apparatus that achieves an improvement in test efficiency by making a simple decision as to whether the test function itself is normal or not without running a diagnostic program mentioned above when abnormal measured values are given in succession for a plurality of ICs.

SUMMARY OF THE INVENTION

According to the present invention, there is provided a method for managing a testing apparatus including making a decision about whether a test function of the testing apparatus, used to inspect IC for defects, is normal or not, which comprises steps of when test results are given that there were successive defects in mutually different test pieces, measuring a standard sample by said testing apparatus; and making a decision that the test function is normal if a result of the measurement of the standard sample is within a specified tolerance range, or making a decision that the test function is abnormal if a result of the measurement is outside the specified tolerance range.

The standard sample used in the managing method according to the present invention is a sample that shows electrical characteristics within a specified tolerance. Therefore, when the standard sample is measured, if a measured value of this sample is within the specified tolerance mentioned above, the test function is considered to be normal, and if the measured value is outside the specified tolerance, the test function itself is considered to be abnormal.

Therefore, according to the method of this patent application, it is possible to easily make a decision as to whether or not abnormality lies in the test function without executing a diagnostic program for diagnosis of the test function of the testing apparatus.

In the above-mentioned decision as a simple decision, when the test function is determined as abnormal, the diagnostic program can be executed automatically to make sure in which part of the test function the abnormality lies.

According to another invention, there is provided a testing apparatus for ICs, which comprises a test sample placement part for having a plurality of test samples sequentially placed for test in order to inspect ICs for defects;

a handling mechanism for transferring said test samples to the placement part;

a test function part for testing the test samples placed on the test sample placement part, and a standard sample holder for placing a standard sample used for deciding whether the test function part is normal or not, wherein when the plurality of test samples, inspected successively, were each determined to have a defect, the handling mechanism transfers the standard sample from the standard sample holder to the test sample placement part to test the standard sample in place of the test sample.

In the above-mentioned testing apparatus according to the present invention, when defective articles were detected continuously in the ICs, the handling mechanism transfers the above-mentioned standard sample to the test sample placement part, where the standard sample is tested by the test function part of the testing apparatus. In this way, the above-mentioned managing method of the testing apparatus according to the present invention can be carried out easily.

With this testing apparatus, if the measured value obtained by using the standard sample is within a specified tolerance, it is decided that the test function part is normal, or if the measured value is outside the specified tolerance, it is decided that the test function part is abnormal.

The testing apparatus may be provided with a self-diagnostic function part for carrying out diagnosis of the test function part when a decision has been made that the test function part is abnormal.

As the test sample and the standard sample, molded IC modules may be used.

As the test sample, an IC module having a number of ICs formed in a semiconductor wafer may be used and, on the other hand, as the standard sample, a molded IC package corresponding to the above-mentioned IC module may be used.

As the standard sample, one of the ICs that have been determined as normal by the above-mentioned test may be used.

BRIEF DESCRIPTION OF THE DRAWINGS

FIG. 3 is a flowchart showing part of the operation of the testing apparatus shown in FIG. 1.

DESCRIPTION OF PREFERRED EMBODIMENTS

The features of the present invention will become apparent in the detailed description made with reference to embodiments that follow.
<Embodiment>

Figure 1:
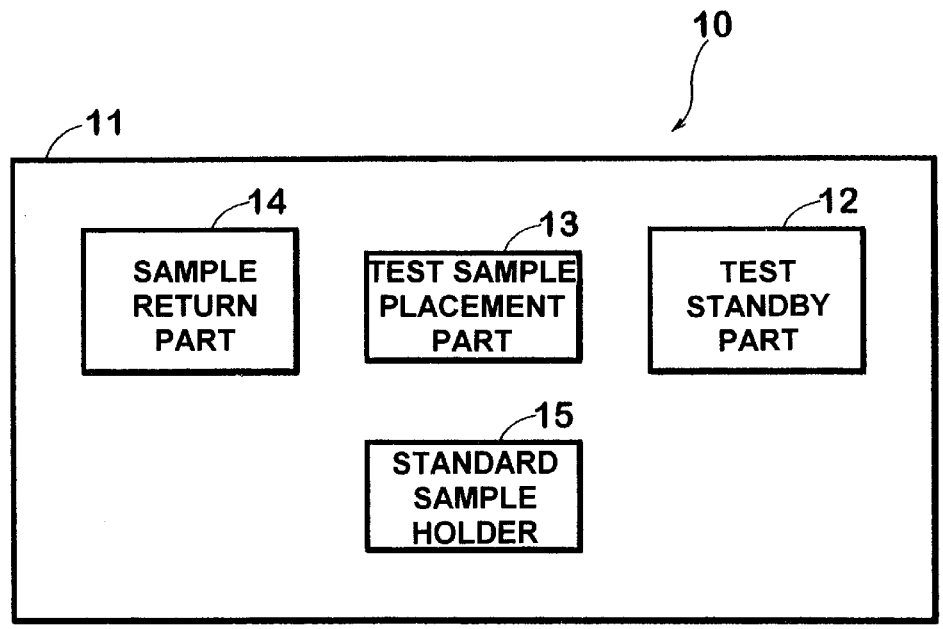
FIG. 1 is a plan view schematically showing a part of the testing apparatus according to the present invention.

FIG. 1 is a part of the testing apparatus to which the apparatus managing method according to the present invention is applied.

The testing apparatus 10 according to the present invention performs a test on IC chips such as molded IC modules as test samples to make a decision about whether or not the test sample exhibits specified electrical characteristics. The testing apparatus 10 has a housing in a generally rectangular shape, and has on the top surface of the housing a test bench 11 for carrying out characteristic tests as shown in FIG. 1.

The test bench 11 comprises a test standby part 12 for accommodating a plurality of IC chips (not shown) arranged on a tray (not shown), for example, and waiting to undergo measurement, a test sample placement part 13 for receiving IC chips to be tested, which are sequentially supplied from the standby part, a sample return part 14 arranged symmetrical with the test standby part 12 in relation to the test sample placement part 13 and provided with a tray (not shown) for receiving sequentially the IC chips that have undergone the above-mentioned measurement at the test sample placement part, and a standard sample holder 15 where an IC chip used as the standard sample is held.

Figure 2:
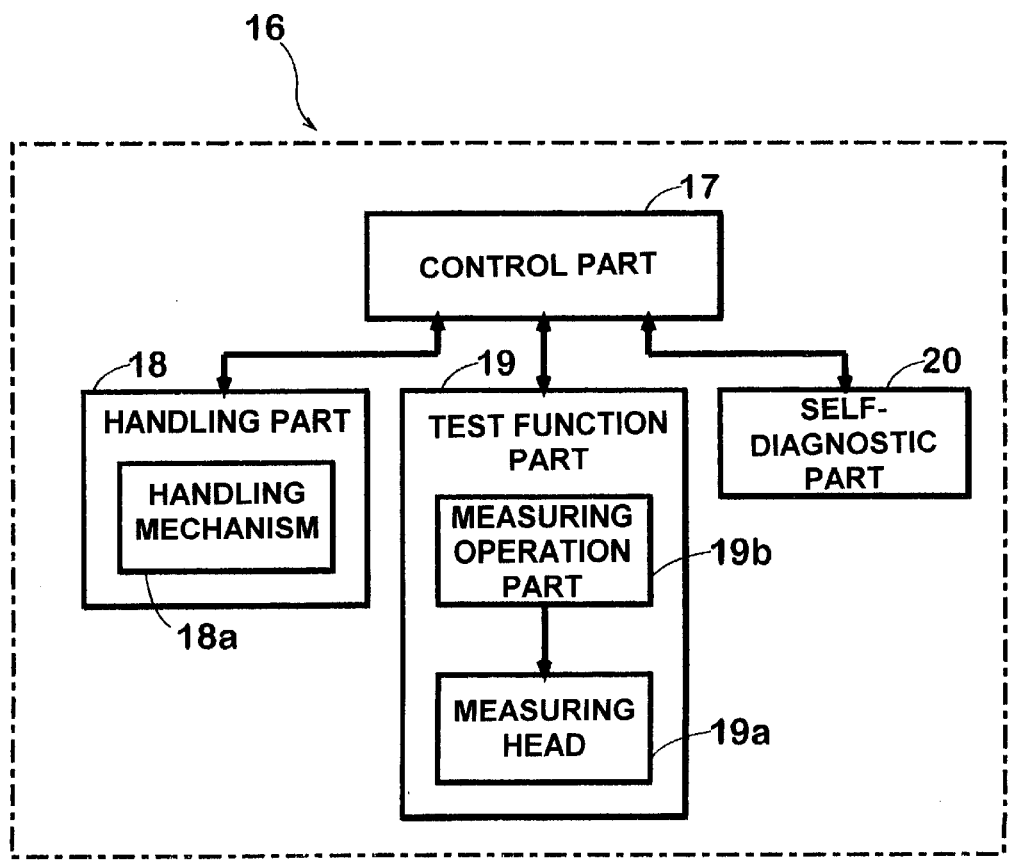
FIG. 2 is a block diagram showing the structure of the testing apparatus shown in FIG. 1.

As shown in FIG. 2, the testing apparatus 10 further comprises an operation controller 16 for controlling the operation of the testing apparatus 10. The operation controller 16 includes a control part 17 having a well-known central processing unit (CPU) for general control of the operation of the testing apparatus 10, a handling part 18 for handling the IC chips under control of the control part 17, a test function part 19 for electrical measurement of the IC chips arranged in the test sample placement part 13, and a self-diagnostic part 20 for executing a well-known diagnostic program for diagnosis of the test function part 19.

The handling part 18 has a handling mechanism 18a, such as a grip arm, for transferring the IC chips in response to a command from the control part 17. The handling part 18, by means of the handling mechanism 18a, in the same way as before, transfers a plurality of IC chips sequentially from the test standby part 12, where the IC chips have been arranged, to the test sample placement part 13 and transfers sequentially the IC chips, on which electrical measurement has been done at the placement part, to the sample return part 14.

As the alternative to transferring IC chips from the test standby part 12 to the test sample placement part 13, the handling part 18, by using the handling mechanism 18a, is operable to transfer the standard sample held by the standard sample holder 15 to the test sample placement part 13.

The test function part 19 is provided with a measuring head 19a with probes for the above-mentioned electrical measurement, and a measuring operation part 19b having held thereto a measuring head 19a replaceable to one suitable for a test sample.

The arrangement of the respective components parts on the test bench 11 is not limited to the positions mentioned above, but may be changed as you think suitable.

Description will now be made of the operation of the testing apparatus 10 according to the present invention. When a number of IC chips bound for test are arranged on the test standby part 12 together with the tray containing the IC chips, one of the IC chips arranged at the standby part 12 is moved by the handling mechanism 18a to the test sample placement part 13.

When the IC chip is placed on the test sample placement part, as is well known, the probes on the measuring head 19a in the test function part 19 are brought into contact with specified connection points on the IC chip. The measuring operation part 19b of the test function 19 performs a specified process on detected values obtained from the probes, and outputs measured data. In this manner, the IC chip on the test sample placement part 13 receives a specified electrical measurement by the test function part 19. Those determined as non-defective articles out of all the IC chips that have undergone the measurement process are transferred by the handling mechanism 18a from the test sample placement part 13 to the sample return part 14.

The IC chips may be placed directly on the test standby part 12 without using the tray for a number of IC chips, and those IC chips may be directly sent directly to the above-mentioned sample return part 14 without installing and using the tray at the sample return part 14.

After the electrical measurement is finished, the testing apparatus 10 operates according to the flowchart in FIG. 3 as described in the following.

The testing apparatus 19 in a step S1, makes a decision that the IC chip on the test sample placement part 13 is a non-defective article if a measured value obtained by the measuring operation part 19b is within a specified tolerance, or makes a decision that the IC chip is defective if the measured value is outside the specified tolerance.

When the IC chip is determined as non-defective, as described above, this IC chip is sent by the handling mechanism 18a to the tray on the sample return part 14 as mentioned above, on which the test sample placement part 13 becomes empty. On the other hand, when the IC chip is determined as defective, this IC chip is removed by a worker, for example, from an inspection line extending from the sample standby part 12 to the sample return part 14, and the sample placement part 13 is thus made empty.

When it is decided from a result of the above-mentioned electrical measurement that an IC chip is a non-defective article as shown in FIG. 3, the handling mechanism 18a transfers another IC chip from the test standby part 12 to the test sample placement part 13 for a test of a subsequent IC chip.

When it has been decided from the electrical measurement result that the IC chip is defective, the test function part 19 further decides whether this defective-article decision occurred successively for a specified number of times or not, in other words, it decides whether or not defective IC chips continued for a specified number of times in a plurality of IC chips that have been measured (Step S2). That specified number of times of occurrence of defective articles can be set by a worker at 2, 3, 4 or any larger number on a pre-setting device, not shown, in the operation control part 16.

Even if a decision has been given that the IC chip is defective, when it is further decided that defective articles did not occur for a specified number of times, as described in the step S1, the handling mechanism 18a transfers an IC chip from the test standby part 12 to the test sample placement part 13 for a test of a subsequent IC chip.

On the other hand, when it has been decided that defective articles occurred a specified number of times, the testing apparatus 10 carries out a simple test to decide whether the reason of occurrence of the successive defectives is defective IC chips merely occur in succession or due to some abnormality on the side of the testing apparatus 10. In this simple test, in order to make a simple decision whether abnormality lies in the IC chips or in the testing apparatus 10, the same electrical measurement as was conducted in the test of IC chips is carried out by using a standard sample having required electrical characteristics that define non-defective IC chips.

To carry out electrical measurement of the above-mentioned IC sample for the simple test, the handling mechanism 18a transfers the standard IC sample from the standard sample holder 15 to the test sample placement part 13 (Step S3).

The standard IC sample placed on the test sample placement part 13 undergoes a specified electrical measurement by the test function 19 in the same way as in the above-mentioned electrical measurement of IC chips. After the measurement, the handling mechanism 18a sends the standard sample from the test sample placement part 13 to the standard sample holder 15 (Step S4).

Since the standard IC sample basically has specified electrical characteristics, if the result of electrical measurement of the standard IC sample is within the above-mentioned tolerance, in other words, when a decision is given that the standard IC sample is a non-defective article, it can be determined that the testing apparatus 10 is normal and that the successive defective articles occurred because a plurality of IC chips, including a defect or defects, happened to be put to the test in succession.

If the result of electrical measurement of the standard IC sample is outside the tolerance, it follows that the standard IC sample, which should be a non-defective article, was determined as defective, so that it can be decided that there is some abnormality in the testing apparatus 10 (Step S5).

Therefore, by the above-mentioned simple test using the standard IC sample, it can be decided whether the IC chip is defective or there is some abnormality in the testing apparatus 10.

When a decision has been made that the standard IC sample is nondefective, as described above, as described above, it is determined that there is no abnormality in the testing apparatus. Therefore, as mentioned in the step S1, to resume a test of IC chips, the handling mechanism 18a transfers one IC chip from the test standby part 12 to the test sample placement part 13.

On the other hand, when a decision has been made that the standard IC sample is defective, by a resulting decision that there is abnormality in the testing apparatus 10, the test operation of the testing apparatus 10 is automatically brought to a temporary halt.

In the example of the testing apparatus 10 according to the present invention, when a decision has been made that there is abnormality in the testing apparatus, to detect the cause of the abnormality, diagnosis is conducted to clarify where in the test function part 19 that performs the test function of the testing apparatus 10 the abnormality has occurred.

To conduct the above-mentioned diagnosis of the test function part 19, a well-known diagnostic program in the self-diagnostic function part 20 is executed by a command from the control part 17. By the execution of this diagnostic program, it is possible, as before, to know whether the cause of the abnormality of the testing apparatus 10 lies in the measuring head 19a, including the probes of the test function part 19 or in the measuring operation part 19b. After this, when necessary, the test function part 19 undergoes repairs by a worker, for example, according to a diagnosis result of the diagnostic program.

As has been described, in the testing apparatus 10 according to the preferred embodiment, if a decision was made that a specified number of defective IC chips occurred continuously in a plurality of IC chips that have undergone electrical measurement for a test, instead of immediately executing the diagnostic program, a simple test is performed using the standard IC sample. By this simple test, it can be decided whether or not the abnormality has occurred in the testing apparatus 10.

Therefore, according to this testing apparatus 10, when defective articles occur for a specified number of times in succession, a decision can be made easily whether the cause of the abnormality lies in the testing apparatus or in IC chips without executing the diagnostic program, so that test efficiency on the earlier-mentioned inspection line can be enhanced.

Because, when the testing apparatus 10 was determined to be abnormal, the diagnostic program is automatically run, the worker can accurately know whether the abnormal portion in the test function part 19 exist in the measuring head 19a or in the measuring operation part 19b. This makes it possible to take a quick action regarding the abnormality of the testing apparatus.

In the above-mentioned preferred embodiment, IC chips have been used as test samples, but the testing apparatus using the management method according to the present invention is not limited to test samples of this kind. For example, a semiconductor wafer in which a number of ICs are formed in high integration may be tested as a test sample.

In this case, a semiconductor wafer, which has been determined by a test to be conforming to specified electrical characteristics, may be used as a standard sample. However, in this case, the solder pads at the IC chips in the wafer as a test sample suffer damage by the pressure repeatedly applied in electrical measurement. Therefore, the standard sample is likely to decrease in durability.

To prevent a decrease in durability, it is desirable to use a wafer having mounted thereon molded IC modules corresponding to the IC chips of the semiconductor wafer instead of using the above-mentioned non-defective semiconductor wafer as the standard sample. In this case, a probe card for the above-mentioned molded IC modules is used as a probe card for measuring the wafer.

In the case of the above-mentioned sample containing molded IC modules, as described above, the probes press the designated leads of the molded IC module at each simple test, but those leads incur less damage than the solder pads by the pressure of the probes, a fact which improves the durability of the standard sample.

If a semiconductor wafer is used as a test sample, when a simple test is performed, instead of supplying the standard sample from the standard sample holder 15 to the test sample placement part 13, it is possible to use as the standard samples the IC chip modules, already tested and determined to be non-defective, of the semiconductor wafer still under measurement at the test sample placement part.

In the above-mentioned example of the testing apparatus, when abnormal measurement results occurred for a specified number of times, a simple test is carried out and the diagnostic program is executed automatically. As an alternative to this procedure of this example, it is possible to carry out the simple test and the diagnostic program according to the present invention by a worker at his discretion.

According to the worker's discretion, it is possible to start the simple test by manipulation by the worker when results of determination of IC chips as abnormal occurs twice in succession, for example, and thus it is possible to carry out the management method according to the present invention.

According to the management method according to the present invention, when test results are given that defective articles were detected successively in the test samples, as described above, without executing a diagnostic program right away, it is possible to decide whether or not the testing function of the testing apparatus is normal in a simple way, so that test stoppage time until the resumption of test of other samples can be reduced. For this reason, it is possible to improve the efficiency of an electrical characteristic test of ICs.

According to the testing apparatus according to the present invention, as mentioned above, because the management method according to the present invention can be carried out relatively easily, it can be quickly decided whether there is abnormality in the testing apparatus and therefore it is possible to prevent a decrease in yield due to the disposal of normal-functioning ICs attributable to abnormality in the testing apparatus.

What is claimed is:

1. A method for managing a testing apparatus including making a decision about whether a test function of said testing apparatus, used to inspect semiconductor integrated circuits provided as a plurality of test samples, is normal and not, comprising the steps of:

measuring a standard sample with said testing apparatus when said testing apparatus determines a specified number of said test samples in succession to be defective;

deciding that said test function is normal if a result of said measurement of said standard sample is within a specified tolerance range, or deciding that said test function is abnormal if said result of said measurement is outside said specified tolerance range; and diagnosing said test function by executing a diagnostic program when said test function is decided to be abnormal.

2. A testing apparatus for inspecting semiconductor integrated circuits for defects, comprising:

a test sample placement part for receiving a plurality of test samples sequentially placed on said test sample placement part for testing;

a handling mechanism for transferring said test samples to said test sample placement part;

a test function part for testing said test sample placed on said test sample placement part;

a standard sample holder for placing a standard sample used for deciding whether said test function part is normal and not; and a self-diagnostic function part for making a diagnosis of said test function part;

wherein said handling mechanism transfers said standard sample from said standard sample holder to said test sample placement part when said test function part determines a specified number of test samples in succession to be defective, to test said standard sample in place of said test sample, and wherein said self diagnostic function part makes said diagnosis of said test function part when said test function part determines said standard sample to be defective as a result of said testing.

3. A testing apparatus according to claim 2, wherein a decision is made that said test function part is normal when a test result by measurement of said standard sample is within a specified tolerance range, or a decision is made that said test function is abnormal when said test result of said measurement is outside said specified tolerance range.

4. A testing apparatus according to claim 2, wherein said test samples and said standard sample are molded IC packages.

5. A testing apparatus according to claim 2, wherein said test samples are a number of said semiconductor integrated circuits formed collectively in a semiconductor wafer, and wherein said standard sample is a molded IC corresponding to said semiconductor integrated circuit.

6. A testing apparatus according to claim 2, wherein said test samples are a number of said semiconductor integrated circuits formed collectively in a semiconductor wafer, and wherein said standard sample is one of said semiconductor integrated circuits already determined to be non-defective by said testing of said semiconductor integrated circuits in said semiconductor wafer.

* * * * *